United States Patent [19]
Porter et al.

[11] Patent Number: 4,805,420
[45] Date of Patent: Feb. 21, 1989

[54] CRYOGENIC VESSEL FOR COOLING ELECTRONIC COMPONENTS

[75] Inventors: Warren W. Porter, Escondido; Donald K. Lauffer, Poway, both of Calif.

[73] Assignee: NCR Corporation, Dayton, Ohio

[21] Appl. No.: 64,626

[22] Filed: Jun. 22, 1987

[51] Int. Cl.[4] .............................................. F25B 19/00
[52] U.S. Cl. .................. 62/514 R; 174/15.4; 357/83; 361/385
[58] Field of Search ............ 174/15 R, 15 CA; 62/45, 62/514 R; 357/83; 361/385

[56] References Cited

U.S. PATENT DOCUMENTS

| | | | |
|---|---|---|---|
| 3,202,869 | 8/1965 | Matson et al. | 361/386 |
| 3,586,917 | 6/1971 | Oates | 564/411 |
| 3,706,010 | 12/1972 | Laermer et al. | 361/382 |
| 3,748,535 | 7/1973 | Nelson | 174/15 R |
| 3,801,938 | 4/1974 | Goshgarian | 333/247 |
| 3,858,971 | 1/1975 | Studley | 353/61 |
| 3,946,276 | 3/1976 | Braun | 361/385 |
| 4,027,728 | 6/1977 | Kobayashi et al. | 174/15 R |
| 4,115,836 | 9/1978 | Hutchison et al. | 361/382 |
| 4,118,947 | 10/1978 | Diedrich et al. | 62/514 R |
| 4,394,634 | 7/1983 | Vansant | 174/15 CA |
| 4,440,971 | 4/1984 | Harrold | 174/15 R |
| 4,535,595 | 8/1985 | Keller et al. | 62/514 R |
| 4,559,580 | 12/1985 | Lutfy | 361/385 |
| 4,661,707 | 4/1987 | Jungtman et al. | 62/514 R |

Primary Examiner—Ronald C. Capossela
Attorney, Agent, or Firm—Wilbert Hawk, Jr.; Edward Dugas; Floyd A. Gonzalez

[57] ABSTRACT

A cryogenic vessel for cooling electronic components, wherein the cryogenic vessel includes a pair of vessel portions, each vessel portion having an outer wall and an interior immersion chamber. A membrane member is located between the vessel portions for separating the mentioned immersion chambers. The membrane member includes openings for providing fluid transfer between the immersion chambers of the vessel portions and a portion extending from between the vessel portions to a point exterior of the vessel portions. Sealing members are located between the membrane member and each of the vessel portions for providing a fluid tight seal of the immersion chambers. An electronic component mounting socket is located on a portion of the membrane member within the immersion chambers for mounting an electronic component to be cooled. A supply conduit through the outer wall of one of the vessel portions introduces cryogenic fluid into the immersion chambers.

12 Claims, 3 Drawing Sheets

CRYOGENIC VESSEL FOR COOLING ELECTRONIC COMPONENTS

BACKGROUND OF THE INVENTION

The present invention is related to cryogenic vessels, and is more particularly related to cryogenic vessels for cooling electronic components such as integrated circuit chips.

U.S. Pat. No. 4,027,728 to Kobayashi et al. issued June 7, 1977 for "Vapor Cooling Device for Semiconductor Device" discloses a cooling vessel in which a semiconductor device is immersed in a cooling medium in its liquid phase. The cooling medium changes to its vapor phase due to the heat of the semiconductor, and rises to a condenser where it is condensed to its liquid phase and returned to the vessel.

U.S. Pat. No. 4,394,634 to Vansant issued July 19, 1983 for "Vapor Cooled Current Lead for Cryogenic Electrical Equipment" discloses a current lead which is cooled by a fluid coolent moving through the current lead from cryogenic electrical equipment.

SUMMARY OF THE INVENTION

In a specific embodiment, a cryogenic vessel for cooling electronic components is disclosed wherein the cryogenic vessel includes a pair of vessel portions, each vessel portion having an outer wall and an interior immersion chamber. A membrane member is located between the vessel portions for separating the mentioned immersion chambers The membrane member includes openings for providing fluid transfer between the immersion chambers of the vessel portions and a portion extending from between the vessel portions to a point exterior of the vessel portions. Sealing members are located between the membrane member and each of the vessel portions for providing a fluid tight seal of the immersion chambers. An electronic component mounting socket is located on a portion of the membrane member within the immersion chambers for mounting an electronic component to be cooled. A supply conduit, through the outer wall of one of the vessel portions, introduces cryogenic fluid into the immersion chambers.

It is an object of the present invention to provide a cryogenic vessel for cooling electrical components.

It is a further object of the present invention to provide a cryogenic vessel having a pair of vessel portions which may be clamped together for forming an immersion chamber in which may be placed an electrical component to be cooled.

It is a further object of the present invention to provide a cryogenic vessel having a pair of vessel portions having a flexible membrane therebetween on which an electrical component to be cooled is mounted.

It is a further object of the present invention to provide a cryogenic vessel having a pair of vessel portions separated by a flexible membrane having holes therein for allowing fluid flow, including cryogenic liquid and gasses, from one vessel portion to the other.

These and other objects of the present invention will become apparent from the drawings and description of the preferred embodiment disclosed herein.

DESCRIPTION OF THE PREFERRED EMBODIMENT

Figure 1:
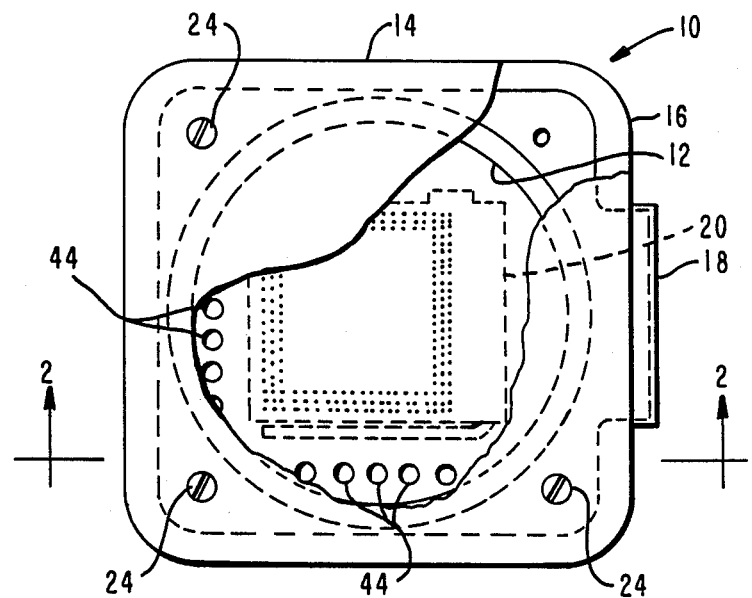
FIG. 1 is a top view of the cryogenic vessel of the present invention with a portion of the top cut away exposing an chamber within.
Figure 2:
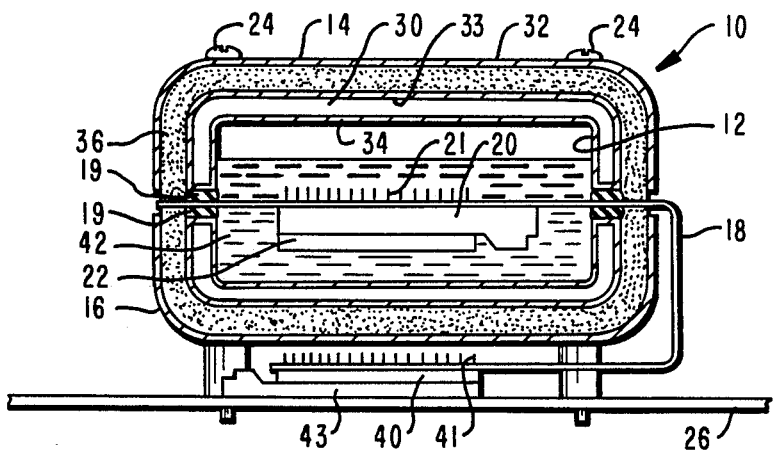
FIG. 2 is a sectioned side view of the cryogenic vessel taken along line 2—2 of FIG. 1.

FIG. 1 is a top view of a cryogenic vessel 10 with a portion of the top cut away exposing an immersion chamber 12 within, and FIG. 2 is a sectioned side view of the cryogenic vessel 10 of FIG. 1.

Referring to both FIGS. 1 and 2, the cryogenic vessel 10 is made up of two insulated vessel portions 14 and 16 which may be symmetrical and which are separated by a flexible membrane 18 located between a pair of seals 19. The flexible membrane 18 has an integrated circuit (IC) socket 20 located near one end such that an IC chip 22 connected to the IC socket 20 is located within one of the immersion chambers 12. As will be discussed in connection with FIG. 5, the flexible membrane 18 may include a plurality of IC connectors, as desired.

The cryogenic vessel 10 is secured by mounting hardware, such as bolts 24, to a printed circuit board 26 (see FIG. 2). Each symmetrical portion 14 and 16 includes an outer wall 32 and an inner wall 34. Next to the outer wall 32 is a layer of insulating material 36 such as a closed cell plastic foam which provides mechanical strength to the outer wall 32 and is sized to allow for a tight vapor seal between the symmetrical vessel portions 14 and 16 and the flexible membrane 18 trapped therebetween when the vessel portions 14 and 16 are clamped together by the bolts 24. A vacuum chamber 30 is defined by the inner wall 34 and a chamber wall 33 next to the insulating layer 36. Each vacuum chamber 30 is shaped to form an enclosure and is welded shut. The vacuum chamber 30 forms a layer of super insulation around the immersion chamber 12 of each vessel portion 14 and 16. The insulation layers 36 of the vessel portions 14 and 16, together with the flexible membrane 18 between the seals 19, seal the immersion chambers 12 from the ambient environment external of the sealed cryogenic vessel 10, thereby containing a cryogenic liquid 42 in the immersion chambers 12 and preventing frost formation.

The flexible membrane 18 may be a commercially available flex-circuit made of material which does not become rigid at cryogenic temperatures such as, for instance, a polyimide or Teflon material. Teflon is a trademark of E. I. Du Pont de Nemours and Company.

The flexible membrane 18 contains internal electrical conductors 25(see FIG. 6) which may have controlled impedances for different circuit applications, and which provide electrical connections between the IC socket 20 and a plug-in adapter 40 for plugging into a socket 43 mounted on the printed circuit board 26. The IC socket 20 and plug-in adapter 40 have pins 21 and 41, respectively, which are soldered to individual conductors 25 in the flexible membrane 18 to form the electrical connections. The immersion chambers 12 contain the cryogenic liquid 42, such as liquid nitrogen, for completely surrounding the IC chip 22 for providing cooling thereto. Fluid transfer, including cryogenic liquid and gasses, between the vessel portions 14 and 16 is provided by holes or openings 44 in the flexible membrane 18 which are regularly spaced around the periphery of the IC socket 20(see FIG. 1). Thus, as will be discussed in connection with FIGS. 3 and 4, cryogenic liquid 42 may be introduced into the immersion chamber 12 of one of the symmetrical vessel portions 14 or 16, to flow freely through the holes 44 into the other cryogenic vessel portion, to surround the IC chip 22 to be cooled.

Figure 3:
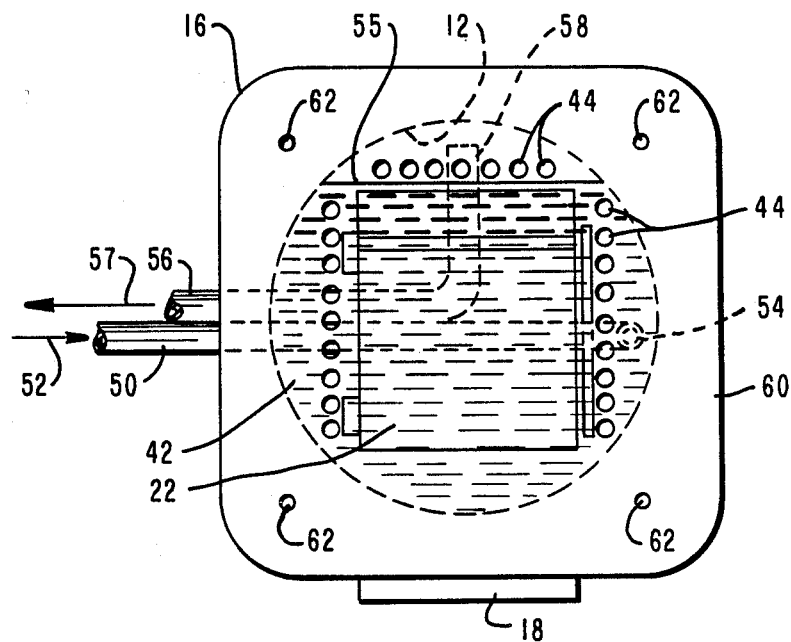
FIG. 3 is an elevational view of a portion of the cryogenic vessel of the present invention mounted in a vertical arrangement.

FIG. 3 is an elevational view of one of the cryogenic vessel portions 16 with the other vessel portion 14 removed, the vessel portion 16 being mounted in a vertical arrangement. The immersion chamber 12 of vessel portion 16 is shown in phantom. As shown by the arrow 52, cryogenic liquid 42 is introduced into the immersion chamber 12 through a tube 50 which passes through the outer wall 32, the insulating material 36, and the vacuum chamber 30 of the vessel portion 16. The cryogenic liquid 42 exits the tube 50 at its terminal end 54, which is arranged to be below the liquid-gas interface 55 of the immersion chamber 12. As the cryogenic liquid 42 cools the chip 22, it boils off to a gaseous state. The resulting gas is exhausted from the immersion chamber 12 through a tube 56, as shown by the arrow 57, whose terminal end 58 is above the liquid-gas interface 55. The flexible membrane 18 has an enlarged portion 60 which covers the cryogenic vessel portion 16, dividing the symmetrical vessel portions 14 and 16, when the vessel portions 14 and 16 are assembled to form the cryogenic vessel 10. The flexible membrane portion 60 includes holes 62 through which the bolts 24 may pass for clamping the vessel portions 14 and 16 together, as explained in connection with FIGS. 1 and 2.

Figure 4:
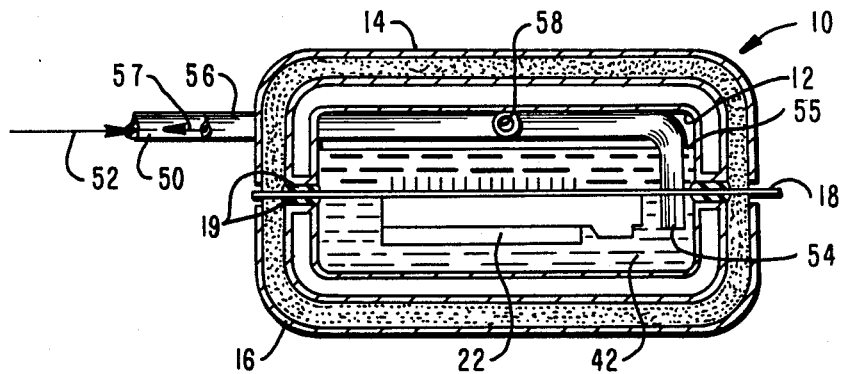
FIG. 4 is a sectioned side view of the cryogenic vessel of the present invention mounted in a horizontal arrangement.

FIG. 4 is a sectioned side view of another embodiment of the cryogenic vessel 10 mounted in a horizontal arrangement. In the arrangement of FIG. 4, cryogenic liquid 42 flows through the tube 50, as shown by arrow 52, to exit at its terminal end 54 which has been turned to be below the liquid-gas interface 55 when the vessel 10 is mounted horizontally. The tube 56 has its terminal end 58 turned to be above the liquid-gas interface 55 for exhausting gas which boils off of the cryogenic liquid 42 as the chip 22 is cooled (see arrow 57).

Figure 5:
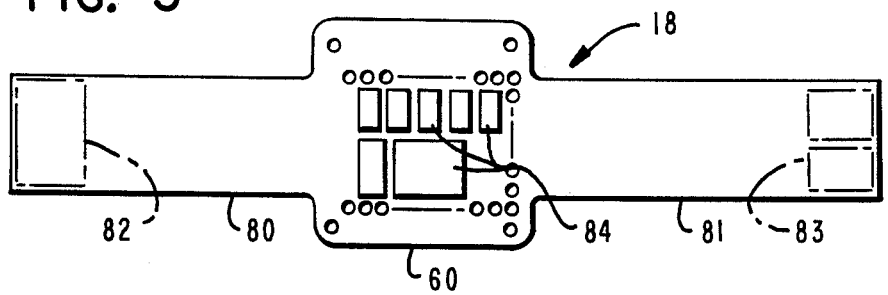
FIG. 5 is one embodiment of a flexible membrane usable with the cryogenic vessel of the present invention.
Figure 6:
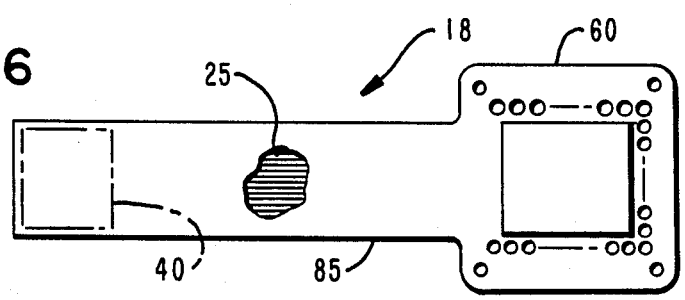
FIG. 6 is another embodiment of a flexible membrane usable with the cryogenic vessel of the present invention with a portion of its surface broken away to expose electrical conductors within.
Figure 7:
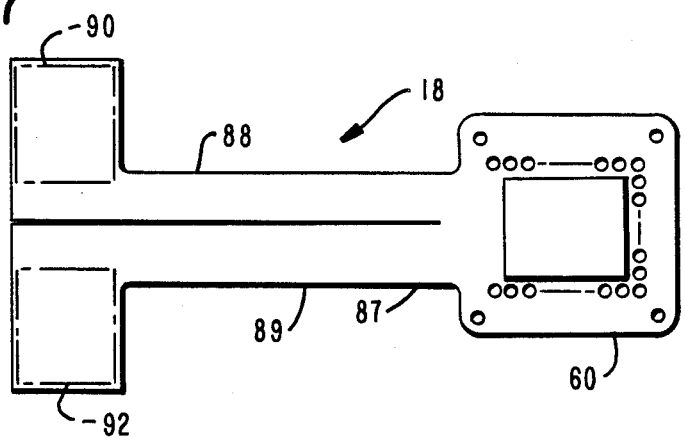
FIG. 7 is another embodiment of a flexible membrane usable with the cryogenic vessel of the present invention.

FIGS. 5, 6 and 7 show several possible embodiments of the flexible membrane 18 for dividing the symmetrical vessel portions 14 and 16 (see FIGS. 2 and 4). The embodiment of FIG. 5 has a centrally located enlarged portion 60 and narrow, elongated portions 80 and 81 extending in opposite directions therefrom. Plug-in adapters 82 and 83 are located at each end of the elongated portions 80 and 81, respectively, for providing electrical connections to electrical conductors (not shown) in the flexible membrane 18, which, in turn, are connected to a plurality of IC chips 84 on the enlarged portion 60.

FIG. 6 is the embodiment of the flexible membrane 18 of FIGS. 2 and 4 wherein the enlarged portion 60 is at one end of a narrow, elongated portion 85 with the plug-in adapter 40 at the other end.

FIG. 7 is yet another embodiment of the flexible membrane 18 wherein an elongated portion 87, leading from the enlarged portion 60, is divided into members 88 and 89. Member 88 is terminated by a plug-in adapter 90, and member 89 is terminated by a plug-in adapter 92. The configuration of FIG. 7 is especially useful wherein the plug-in adapters 90 and 92 are to be plugged into sockets on separate printed circuit boards or into separate sockets on opposite sides of a multilayer circuit board, as desired.

Thus, a cryogenic vessel has been described which provides the aforementioned objects. It will be understood by those skilled in the art that the disclosed embodiments are exemplary only, and that various elements disclosed herein may be replaced by equivalents without departing from the invention hereof, which equivalents are intended to be covered by the appended claims.

What is claimed is:

1. A cryogenic vessel for cooling electronic components, said cryogenic vessel comprising:
   a pair of vessel portions, each having an outer wall and an interior immersion chamber;
   a membrane member between said vessel portions for separating said immersion chambers, said membrane member having opening means therein for providing fluid transfer between the immersion chambers of said vessel portions and a portion extending from between said vessel portions to a point exterior of said vessel portions;
   sealing means between said membrane member and each of said vessel portions for providing a fluid tight seal of said immersion chambers; and
   electronic component mounting means on a portion of said membrane member within said immersion chambers for mounting thereon an electronic component to be cooled.

2. The cryogenic vessel of claim 1 further comprising:
   supply conduit means through the outer wall of one of said vessel portions for introducing cryogenic fluid into said immersion chambers; and
   exhaust conduit means through the outer wall of one of said vessel portions for exhausting gas from said immersion chambers.

3. The cryogenic vessel of claim 2 further comprising clamping means for clamping said vessel portions together.

4. The cryogenic vessel of claim 3 wherein said clamping means further comprises means for mounting said clamped together vessel portions onto a printed circuit board.

5. The cryogenic vessel of claim 3 wherein said membrane member includes electrical conductor means connected to said electronic component mounting means, said electrical conductor means extending within said membrane member from said electronic component mounting means to the point exterior of said vessel portions.

6. The cryogenic vessel of claim 5 wherein said membrane member is a flex-circuit.

7. The cryogenic vessel of claim 5 further comprising:

cryogenic fluids in said immersion chambers, said cryogenic fluids having a liquid-gas interface;

said supply conduit having a terminal end in said immersion chambers below said liquid-gas interface; and said exhaust conduit having a terminal end in said immersion chambers above said liquid-gas interface.

8. The cryogenic vessel of claim 2 wherein each of said vessel portions includes an insulating vacuum chamber between its outer wall and its immersion chamber, said insulating vacuum chambers surrounding said immersion chambers, and said sealing means includes a sealing member between each of said vacuum chambers and said membrane member for effecting fluid tight seals therebetween.

9. The cryogenic vessel of claim 8 wherein each of said vessel portions further includes a layer of insulating material between its outer wall and its insulating vacuum chamber, said layers of insulating material sized to contact said membrane member for making vapor tight seals therewith.

10. The cryogenic vessel of claim 8 wherein said layer of insulating material is made of a closed cell plastic foam.

11. A vessel for cooling electronic components with a cryogenic fluid, said vessel comprising:

a membrane located within said vessel and defining and separating interior immersion chambers, said membrane having opening means therein for allowing fluid transfer between the immersion chambers; and electronic component mounting means on a portion of said membrane for mounting thereon an electronic component to be cooled.

12. The cryogenic vessel of claim 11 further comprising conduit means through the outer wall of said vessel for introducing cryogenic fluid into said immersion chambers and exhausting fluid therefrom.

* * * * *